United States Patent [19]
Fischman et al.

[11] 3,934,207
[45] Jan. 20, 1976

[54] FREQUENCY DISCRIMINATOR UTILIZING SURFACE WAVE DEVICES

[75] Inventors: Martin Fischman; G. Norman Williams, both of Seneca Falls, N.Y.

[73] Assignee: GTE Sylvania Incorporated, Stamford, Conn.

[22] Filed: Oct. 21, 1974

[21] Appl. No.: 516,175

[52] U.S. Cl............ 329/117; 307/233 R; 328/147; 329/118; 329/141; 329/142; 329/204
[51] Int. Cl.²................................. H03D 3/16
[58] Field of Search............ 329/110, 116–118, 329/140–142, 204, 205 R; 307/233 R; 328/140, 141; 333/30 R, 71, 72; 358/23–25; 325/349

[56] References Cited
UNITED STATES PATENTS

| | | | |
|---|---|---|---|
| 3,383,607 | 5/1968 | Avins | 329/205 R X |
| 3,417,336 | 12/1968 | Cribbs et al. | 307/233 X |
| 3,750,027 | 7/1973 | Hartmann | 329/140 X |
| 3,810,257 | 2/1973 | Jones et al. | 333/30 R |
| 3,835,422 | 9/1974 | Hartemann | 333/30 R X |
| 3,869,682 | 3/1975 | Heeks et al. | 333/30 R X |

*Primary Examiner*—Siegfried H. Grimm
*Attorney, Agent, or Firm*—Norman J. O'Malley; Robert E. Walrath; Robert T. Orner

[57] ABSTRACT

Frequency discriminators utilizing a pair of surface wave devices each comprising one transducer on a piezoelectric substrate connected in parallel with a signal source and a pair of envelope detectors connected in parallel with the surface wave devices are shown.

9 Claims, 7 Drawing Figures

FREQUENCY DISCRIMINATOR UTILIZING SURFACE WAVE DEVICES

CROSS-REFERENCE TO RELATED APPLICATIONS

Fischman et al., "Surface Wave Frequency Discriminator," Ser. No. 417,036, filed Nov. 19, 1973, now abandoned; and Fischman et al., "Frequency Discriminator Utilizing Surface Wave Devices," Ser. No. 516,174 filed Oct. 21, 1974; both assigned to the same assignee as this application.

BACKGROUND OF THE INVENTION

This invention relates to frequency discriminators utilizing surface wave devices and more particularly to frequency discriminators utilizing a pair of surface wave devices each having a single transducer.

Surface wave devices have found a number of applications as frequency selective or responsive devices such as in filters, frequency discriminators, and the like. Such devices normally comprise one or more interdigital transducers disposed on a substrate of piezoelectric material such as lithium niobate, lithium tantalate, PZT, quartz, zinc oxide, zinc sulfide, or cadmium sulfide. Of the various possible piezoelectric materials, lithium niobate is presently preferred, however, depending upon the application and the frequencies of interest, other materials may be used as well and may in some cases be preferred. Surface wave devices possess a number of advantages over frequency responsive circuits constructed of discrete components such as small size, compatability with intergrated circuits, relatively invariant characteristics, bulk fabrication, and the like.

Prior art frequency discriminators utilizing surface wave devices have generally included transmitting and receiving transducers disposed on a piezoelectric substrate. Such devices, however, have parasitic responses due to various parasitic effects such as side lobe response, bulk wave coupling, capacitive and inductive coupling, and the like. Such parasitic effects deleteriously affect the performance of such prior art frequency discriminators. Furthermore, prior art frequency discriminators utilizing transmitting and receiving transducers require relatively complex design and fabrication techniques and have a relatively high insertion loss or low efficiency.

Attempts to circumvent the disadvantages of frequency discriminators utilizing transmitting and receiving transducers have been generally unsuccessful. Some prior art attempts involve the use of designs including surface wave devices with single transducers, however, these prior art techniques have also resulted in transducers with low efficiency and inadequate or deleterious performance.

OBJECTS AND SUMMARY OF THE INVENTION

Accordingly, it is a primary object of this invention to provide frequency discriminators utilizing surface wave devices which obviate the above-noted and other disadvantages of the prior art.

It is a further object of this invention to provide frequency discriminators utilizing surface wave devices with high efficiency and low insertion losses.

It is a further object of this invention to provide frequency discriminators utilizing surface wave devices which can be fabricated using relatively uncomplicated and simple techniques.

It is a further object of this invention to provide frequency discriminators utilizing surface wave devices which have superior performance.

It is a yet further object of this invention to provide frequency discriminators utilizing surface wave devices which are not deleteriously affected by various parasitic responses.

In one aspect of this invention the above and other objects and advantages are achieved in a frequency discriminator including a signal source, first and second surface wave devices, and first and second envelope detectors. The signal source provides a signal having frequencies that vary about a center frequency. Each of the surface wave devices has a transducer with first and second combs of interleaved electrodes disposed on a piezoelectric substrate. The surface wave devices also have impedance maximums at frequencies lower and higher, respectively, than the center frequency. The first and second surface wave devices are connected in parallel with the signal source. The first and second envelope detectors are connected to the first and second surface wave devices, respectively, for providing first and second output signals which are summed to provide a signal having an amplitude representative of the frequency deviation of the signal provided by the signal source from the center frequency.

DETAILED DESCRIPTION OF THE PREFERRED EMBODIMENTS

For a better understanding of the present invention, together with other and further objects, advantages and capabilities thereof, reference is made to the following disclosure in conjunction with the accompanying drawings.

Figure 1:
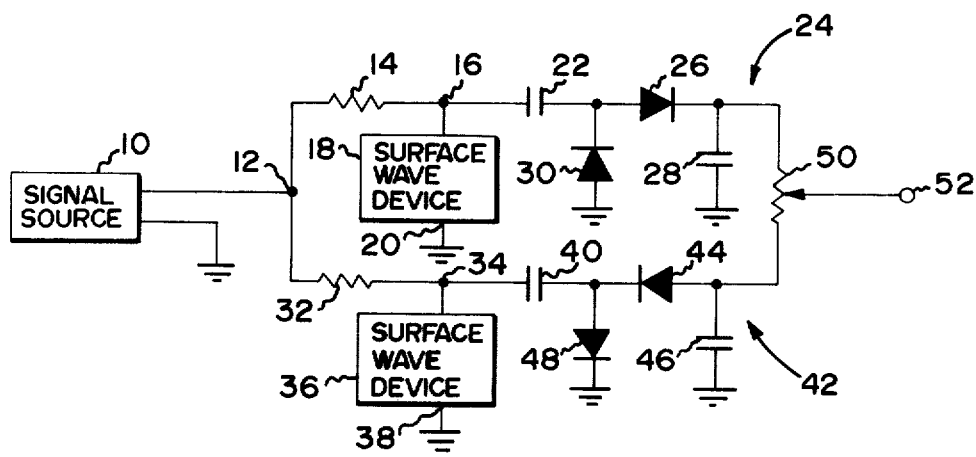
FIG. 1 is a block and schematic diagram of one embodiment of the invention.

In FIG. 1 a signal source 10 is shown which provides a signal having frequencies that vary about a center frequency to a terminal 12. The signal provided to terminal 12 is referenced to a common terminal illustrated as circuit ground. The nature or characteristics of the signal provided by signal source 10 will vary depending upon the application of a frequency discriminator in accordance with the invention. For example, if the frequency discriminator is used in an automatic frequency control (AFC) system in a television receiver, signal source 10 will include an intermediate frequency amplifier stage and the center frequency will typically be 45.75 mHz. In an AFC system the output signal will be applied to a DC or error amplifier coupled to the radio frequency oscillator in the tuner. If, however, the frequency discriminator is used to demodulate an FM signal, such as an intercarrier beat signal in a television receiver, signal source 10 can include the intercarrier detector and the signal provided thereby will typically have a center frequency of 4.5 mHz. In such applications the output signal from the frequency discriminator will typically be coupled to an audio amplifier. Those skilled in the art will realize, however, that a frequency discriminator in accordance with the invention is not limited to television circuitry and may be used, for example, in other FM demodulators and AFC systems as well as in other applications where frequency discriminators are typically used.

Terminal 12 is connected by a resistor 14 to one terminal 16 of a surface wave device 18 which has a second terminal 20 connected to the common terminal illustrated as circuit ground. Terminal 16 is further connected by a coupling capacitor 22 to an envelope detector 24. Envelope detector 24 includes a diode 26 having its anode connected to capacitor 22 and its cathode connected by a capacitor 28 to circuit ground. Another diode 30 is connected between circuit ground and the junction of capacitor 22 and diode 26.

Terminal 12 is further connected by a resistor 32 to one terminal 34 of a surface wave device 36 which has a second terminal 38 connected to circuit ground. Terminal 34 is connected by a coupling capacitor 40 to a second envelope detector 42. Envelope detector 42 has a diode 44 with its cathode connected to capacitor 40 and its anode connected by a capacitor 46 to circuit ground. Another diode 48 is connected from the junction of capacitor 40 and diode 44 to circuit ground.

The junction of diode 26 and capacitor 28 is connected to one end of the resistance element of a potentiometer 50, the other end of which is connected to the junction of diode 44 and capacitor 46. The tape of potentiometer 50 is connected to a terminal 52 which comprises the output terminal of the frequency discriminator. Potentiometer 50 comprises a means for summing the output signals from envelope detectors 24 and 42.

Accordingly, surface wave devices 18 and 36 are connected in parallel with signal source 10. Furthermore, envelope detectors 24 and 42 are connected in parallel with surface wave devices 18 and 36, respectively, as well as in parallel with signal source 10.

Figure 2A:
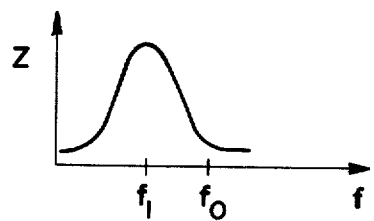
FIGS. 2A, 2B, and 2C are graphs of impedance vs frequency for the surface wave devices used in the invention.
Figure 2B:
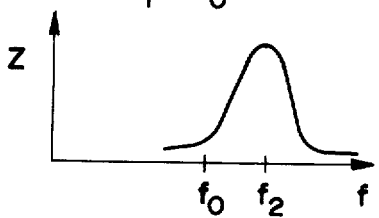
Figure 2C:
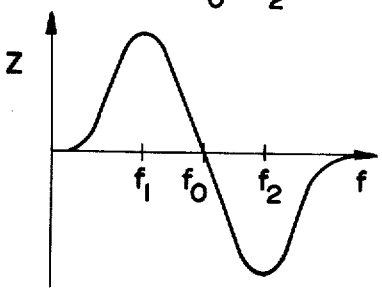

Surface wave device 18 has an amplitude vs frequency response similar to that illustrated in FIG. 2A where $f_0$ is the center frequency of the over-all discriminator response and $f_1$ is the frequency at which surface wave device 18 has an impedance maximum. Similarily, surface wave device 36 has an amplitude vs frequency response similar to that illustrated in FIG. 2B wherein $f_2$ is the frequency at which surface wave device 36 has an impedance maximum. Frequencies $f_1$ and $f_2$ are determined primarily by the geometry of the transducers in surface wave devices 18 and 36. The frequencies are selected such that the composite or over-all frequency response illustrated in FIG. 2C is obtained.

Surface wave devices 18 and 36 convert the signal from signal source 10 into an amplitude modulated signal or a signal with amplitude variations dependent upon the frequency deviation from the center frequency $f_0$. Envelope detectors 24 and 42 detect the amplitude modulations or variations to provide first and second output signals which are summed in potentiometer 50 to provide a composite output signal at output terminal 52 having an amplitude representative of the frequency deviation of the signal provided by signal source 10 from the center frequency $f_0$. The resistive element of potentiometer 50 also provides a DC return for capacitors 28 and 46. Potentiometer 50 is also adjustable so that the two halves of the discriminator can be balanced.

Diodes 30 and 48 provide a DC return for capacitors 22 and 40. Diodes 30 and 48 can be replaced by resistors, however, the diodes also provide voltage doubling action. Diode 30 clamps the junction of capacitor 22 and diode 26 to circuit ground during negative voltage swings. Similarily, diode 48 clamps the junction of capacitor 40 and diode 44 to circuit ground during positive voltage swings thereby providing voltage doubling action. It should also be noted that the phase of the output signal at terminal 52 can be reversed by reversing the polarity of diodes 26, 30, 44, and 48. Similarily, the phase of the output signal can be reversed by exchanging surfaces wave devices 18 and 36.

Figure 3:
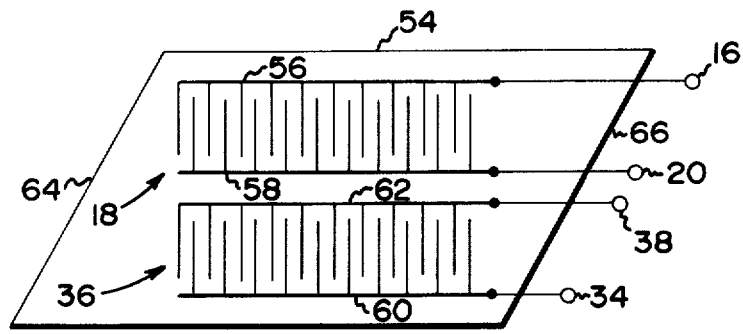
FIGS. 3 and 4 are alternate embodiments of surface wave devices in accordance with the invention.

Surface wave devices 18 and 36 can have separate substrates, however, each preferably includes a single transducer of the interdigital type disposed on a common piezoelectric substrate such as lithium niobate. FIG. 3 is one form of a surface wave device wherein both of devices 18 and 36 are incorporated on a common substrate 54. Device 18 includes an interdigital transducer with first and second combs of electrodes connected to terminals 16 and 20, respectively. The first comb of electrodes includes a base electrode 56, from which the connection to terminal 16 is made, and a plurality of fingers connected thereto. The second comb of electrodes includes a base electrode 58 connected to terminal 20 and a plurality of fingers connected thereto. The fingers of the first and second combs are interleaved to form an interdigital transducer. Device 36 also includes a single transducer with a first comb of electrodes including a base electrode 60 connected to terminal 34 and having a plurality of fingers connected thereto and a second comb of electrodes including a base of electrode 62 connected to terminal 38 and having a plurality of fingers connected thereto interleaved with the fingers connected to base electrode 60 to form an interdigital transducer.

The geometry of transducers 18 and 36 determine their frequency characteristics. The primary variable for determining the frequency characteristics are the number of fingers, the spacing between fingers, and the width of fingers. In typical transducers the widths of the fingers and spacing between adjacent pairs of fingers is one-half wave length. In other words, transducer 18 has spacings between adjacent fingers and widths of fingers corresponding to one-half wave length at frequency $f_1$ while transducer 36 has similar geometric characteristics for frequency $f_2$. The number of fingers is the primary determinate for the band width or Q of the response with the Q increasing with increasing numbers of pairs of fingers.

The ends 64 and 66 of substrate 54 are preferably cut at an appropriate angle so that surface waves transmitted by transducers 18 and 36 reflect at angles such that transducers 18 and 36 do not interact with each other. Furthermore, damping material such as wax can be placed on ends 64 and 66 to absorb incident surface waves.

Figure 4:
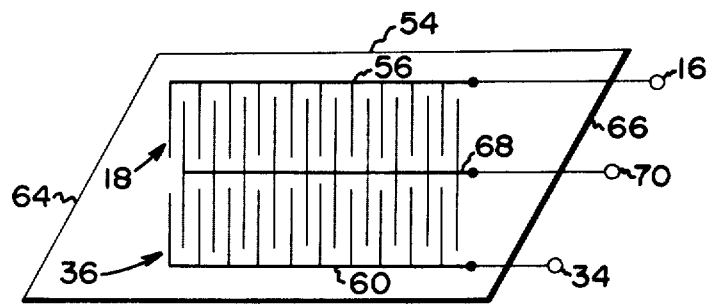

FIG. 4 is a schematic illustration of another embodiment of surface wave devices 18 and 36 wherein both devices are disposed on a common substrate and in addition base electrodes 58 and 62 are replaced by a base electrode 68 common to the second combs of electrodes of transducers 18 and 36. Common base electrode 68 is connected to a terminal 70 which replaces terminals 20 and 38, that is, the common circuit ground terminal of devices 18 and 36. Utilization of common base electrode 68 permits the use of a smaller substrate 54.

Figure 5:
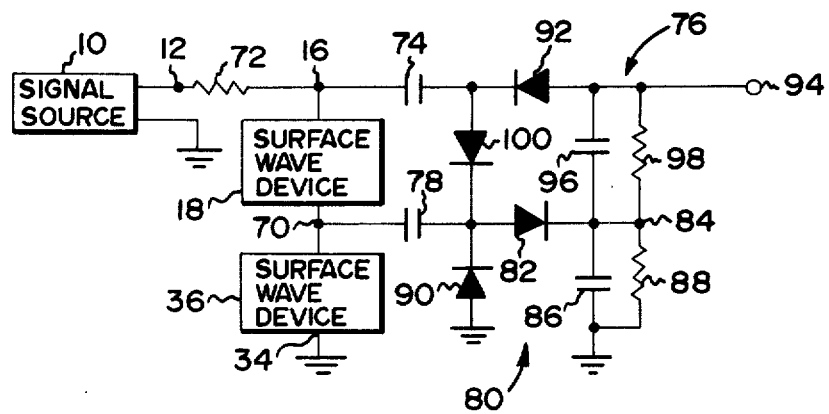
FIG. 5 is a block and schematic diagram of another embodiment of the invention.

In FIG. 5 surface wave devices 18 and 36 are connected in parallel with signal source 10 by connecting devices 18 and 36 in series and further connecting the series combination in parallel with source 10. Output terminal 12 of signal source 10 is connected by a resistor 72 to terminal 16 of surface wave device 18. Surface wave devices 18 and 36 are illustrated with a common terminal 70 therebetween as was shown in FIG. 4. Terminal 34 of device 36 is connected to circuit ground. Alternatively, the embodiment of FIG. 3 can be used or devices 18 and 36 can have separate substrates.

Terminal 16 is connected by a coupling capacitor 74 to a first envelop detector 76 while terminal 70 is connected by a coupling capacitor 78 to a second envelope detector 80. Envelope detector 80 is illustrated as including a diode 82 having its anode connected to capacitor 78 and its cathode connected to a terminal 84 which is further connected by a parallel combination of a capacitor 86 and a resistor 88 to circuit ground. A diode 90 is connected between circuit ground and the junction of capacitor 78 and diode 82.

Envelope detector 76 is illustrated as including a diode 92 having its cathode connected to capacitor 74 and its anode connected to an output terminal 94 which comprises the output terminal of the frequency discriminator. Terminal 94 is further connected by a parallel combination of a capacitor 96 and a resistor 98 to terminal 84. A diode 100 is connected between the junction of capacitior 74 with diode 92 and the junction of capacitor 78 with diode 82. Accordingly, envelope detectors 76 and 80 are connected in series with each other and in parallel with respective ones of devices 18 and 36. Also, the diodes in envelope detectors 76 and 80 are reversed with respect to the envelope detectors illustrated in FIG. 1 so that the output signal will be of the opposite phase.

The operation of the embodiment of FIG. 5 is similar to that of the embodiment of FIG. 1. Resistors 98 and 88 provide DC return paths for capacitors 96 and 86 as well as summing the signals from envelope detectors 76 and 80. When the signal provided by signal source 10 is at the center frequency $f_0$, equal and opposite voltages are developed across resistors 88 and 98 so that the output signal at terminal 94 is zero. When the frequency of the signal provided by signal source 10 deviates from the center frequency, a positive or negative output signal is provided at terminal 94 depending upon the direction of the deviation with the amplitude of the output signal dependent upon the amount of the frequency deviation.

Accordingly, various embodiments of the invention and variations and modifications thereof have been illustrated and described. Frequency discriminators in accordance with the invention provide advantages over the prior art such as extended frequency capabilities, high efficiency, uncomplicated fabrication techniques, alleviation of side lobe responses and other parasitic effects and other similar advantages.

While there has been shown and described what is at present considered the preferred embodiments of the invention it will be obvious to those skilled in the art that various changes and modifications may be made therein without departing from the invention as defined by the appended claims.

We claim as our invention:

1. A frequency discriminator comprising:
    a signal source having first and second terminals for providing a signal at said first terminal having frequencies that vary about a center frequency;
    first and second surface wave devices each having a single transducer with first and second combs of interleaved electrodes disposed on a piezoelectric substrate, said first surface wave device having an impedance maximum at a frequency lower than said center frequency, and said second surface wave device having an impedance maximum at a frequency higher than said center frequency;
    means connecting said first combs of electrodes of each of said first and second surface wave devices to said first terminal and said second combs of electrodes of each of said first and second surface wave devices to said second terminal;
    first and second envelope detectors each having an input terminal connected to said first terminal and a common terminal connected to said second terminal for providing first and second output signals; and
    means connected to said first and second envelope detectors for summing said first and second output signals to provide a signal having an amplitude representative of the frequency deviation of the signal provided by said signal source from said center frequency.

2. A frequency discriminator as defined in claim 1 wherein the transducers of said first and second surface wave devices are disposed on a common substrate.

3. A frequency discriminator as defined in claim 2 wherein one comb of electrodes of the transducer of said first surface wave device has a common base electrode with one comb of electrodes of the transducer of said second surface wave device.

4. A frequency discriminator comprising:
    a signal source having first and second terminals for providing a signal at said first terminal having frequencies that vary about a center frequency;
    a first surface wave device having a single transducer with first and second combs of interleaved electrodes connected to said first and second terminals, respectively, and disposed on a piezoelectric substrate and further having an impedance maximum at a frequency lower than said center frequency;
    a second surface wave device having a single transducer with first and second combs of interleaved electrodes connected to said first and second terminals, respectively, and disposed on a piezoelectric substrate and further having an impedance maximum at a frequency higher than said center frequency;
    first and second envelope detectors each having an input terminal connected to said first terminal and a common terminal connected to said second terminal for providing first and second output signals; and
    means connected to said first and second envelope detectors for summing said first and second output signals to provide a signal having an amplitude representative of the frequency deviation of the signal provided by said signal source from said center frequency.

5. A frequency discriminator as defined in claim 4 wherein the transducers of said first and second surface wave devices are disposed on a common substrate.

6. A frequency discriminator as defined in claim 5 wherein one comb of electrodes of the transducer of said first surface wave device has a common base electrode with one comb of electrodes of the transducer of said second surface wave device.

7. A frequency discriminator comprising:
 a signal source having first and second terminals for providing a signal at said first terminal having frequencies that vary about a center frequency;
 first and second surface wave devices each having a single transducer with first and second combs of interleaved electrodes disposed on a piezoelectric substrate, said first and second surface wave devices having impedance maximums at frequencies lower and higher, respectively, than said center frequency;
 means connecting said first comb of electrodes of said first surface wave device of said first terminal, said second comb of electrodes of said first surface wave device to said first comb of electrodes of said second surface wave device, and said second comb of electrodes of said second surface wave device to said second terminal; and
 first and second envelope detectors connected in parallel with said first and second surface wave devices, respectively, and further connected in series for providing an output signal having an amplitude representative of the frequency deviation of the signal provided by said signal source from said center frequency.

8. A frequency discriminator as defined in claim 7 wherein the transducers of said first and second surface wave devices are disposed on a common substrate.

9. A frequency discriminator as defined in claim 8 wherein one comb of electrodes of the transducer of said first surface wave device has a common base electrode with one comb of electrodes of the transducer of said second surface wave device.

* * * * *